United States Patent
Yang et al.

(10) Patent No.: US 12,051,660 B2
(45) Date of Patent: Jul. 30, 2024

(54) WIRE BOND PAD DESIGN FOR COMPACT STACKED-DIE PACKAGE

(71) Applicant: Western Digital Technologies, Inc., San Jose, CA (US)

(72) Inventors: Xuyi Yang, Shanghai (CN); Fuqiang Xiao, Shanghai (CN); Cong Zhang, Shanghai (CN); Kuo-Chien Wang, Zhubei (TW); Chin-Tien Chiu, Taichung (TW)

(73) Assignee: Western Digital Technologies, Inc., San Jose, CA (US)

( * ) Notice: Subject to any disclaimer, the term of this patent is extended or adjusted under 35 U.S.C. 154(b) by 229 days.

(21) Appl. No.: 17/514,771

(22) Filed: Oct. 29, 2021

(65) Prior Publication Data

US 2022/0052002 A1 Feb. 17, 2022

Related U.S. Application Data

(62) Division of application No. 16/705,940, filed on Dec. 6, 2019, now Pat. No. 11,189,582.

(30) Foreign Application Priority Data

Nov. 18, 2019 (CN) .......................... 201911127224.8

(51) Int. Cl.
*H01L 23/00* (2006.01)
*H01L 25/00* (2006.01)
*H01L 25/065* (2023.01)

(52) U.S. Cl.
CPC .............. *H01L 24/05* (2013.01); *H01L 24/03* (2013.01); *H01L 24/43* (2013.01); *H01L 24/45* (2013.01); *H01L 25/0657* (2013.01); *H01L 25/50* (2013.01); *H01L 2224/4503* (2013.01)

(58) Field of Classification Search
CPC ................. H01L 25/0657; H01L 24/05; H01L 2224/4503
See application file for complete search history.

(56) References Cited

U.S. PATENT DOCUMENTS

| | | | |
|---|---|---|---|
| 10,534,148 B2* | 1/2020 | Morris | G02B 6/3616 |
| 2013/0093080 A1* | 4/2013 | Han | H01L 24/48 |
| | | | 257/E21.531 |

* cited by examiner

*Primary Examiner* — Dale E Page
*Assistant Examiner* — Wilner Jean Baptiste
(74) *Attorney, Agent, or Firm* — Morgan, Lewis & Bockius LLP

(57) ABSTRACT

Systems, methods, and devices for 3D packaging. In some embodiments, a semiconductor package includes a first die and a second die. The first die includes a first bonding pad on a top of the first die and near a first edge of the first die. The second die includes a second bonding pad on a top of the second die and near a second edge of the second die. A pillar is located on the second bonding pad. The first die is mounted on top of the second die such that the first edge is parallel to the second edge and offset from the second edge such that the pillar is exposed. A wire is bonded to a bonding surface of the pillar and bonded to a bonding surface of the first bonding pad.

17 Claims, 13 Drawing Sheets

and so on.

WIRE BOND PAD DESIGN FOR COMPACT STACKED-DIE PACKAGE

CROSS REFERENCE TO RELATED APPLICATIONS

This application claims the benefit of U.S. patent application Ser. No. 16/705,940, filed Dec. 6, 2019, the content of which is hereby incorporated by reference herein.

FIELD OF INVENTION

This application relates to semiconductor device assembly and, more particularly, to electrically connecting bonding pads of stacked dies.

BACKGROUND

Modern integrated circuit (IC) packages may include a plurality of vertically stacked semiconductor dies. Such packages are typically referred to as three dimensional (3D) vertical packages, or stacked-die packages. Circuits implemented on the vertically stacked dies are electrically interconnected between dies using various techniques, such as wire bonding.

In some forms of 3D stacked-die packaging, wire bonding entails attaching one end of a wire to a wire bond pad of one semiconductor die in a stack of dies, and attaching the other end of the wire to a wire bond pad of another die in the stack. Wire bonding is typically performed using a wire bonding machine, which includes a capillary through which the bond wire is threaded, and which connects the bond wire to the bonding pads using pressure, heat, and/or ultrasonic energy. Edges of the stacked dies are offset from one another in a "shingle stacked" configuration in some cases, e.g., to facilitate bonding of wires to the bonding pads disposed on the dies near the offset edges.

However, in order to decrease the size of the package, it is desirable to reduce the offset of the dies in the die stack, but then there is a risk of the bond wires touching the edges of the dies or the wire bonding apparatus being unable to make a good wire bond because the bonding pads of one die are too close to the edge of the die stacked thereon. Accordingly, it would be advantageous to be able to reduce the package size yet still be able to make reliable electrical connections between dies.

SUMMARY

Systems, methods, and devices for 3D packaging are disclosed. In some embodiments, a semiconductor package includes a first die and a second die. The first die includes a first bonding pad on top of the first die and near a first edge of the first die. The second die includes a second bonding pad top of the second die and near a second edge of the second die. A pillar is located on the second bonding pad. The first die is mounted on top of the second die such that the first edge is parallel to the second edge and offset from the second edge. The first edge is offset from the second edge such that the pillar is exposed. A wire is bonded to a bonding surface of the pillar and bonded to a bonding surface of the first bonding pad.

BRIEF DESCRIPTION OF THE DRAWING(S)

DETAILED DESCRIPTION OF THE PREFERRED EMBODIMENT(S)

Semiconductor dies typically are produced by a foundry with wire bonding pads set at a distance from the edge of the die that is specific to the process used to fabricate the die. If such dies are "shingle" or "staircase" stacked to expose the wire bonding pads, the offset between edges of two overlapping dies is a minimum of the distance from the edge of one of the dies to its bonding pad, and a minimum clearance between the bonding pad and the edge of the next higher die in the stack. The minimum clearance is provided to allow a wire bonding apparatus to bond a wire to the bonding pad without contacting the die edge of the next higher die in the stack or causing the wire to contact the die edge of the next higher die in the stack. The offset between the edges of the stacked dies increases the total area of the stack of dies, which may be undesirable in some cases.

Figure 1:
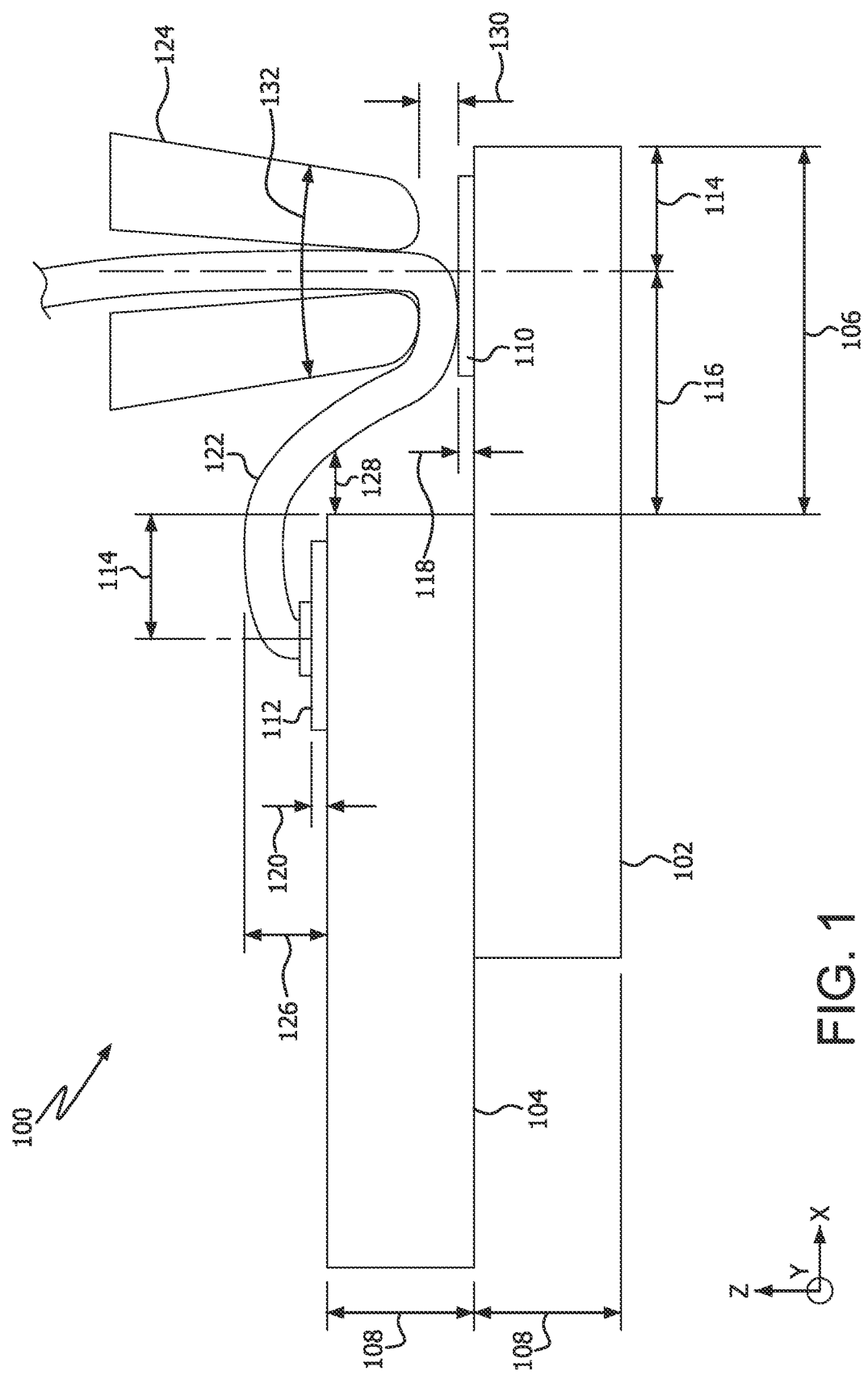
FIG. 1 is a cross-sectional view of a stack of semiconductor dies, illustrating example wire bond design rules.

Referring now to FIG. 1, a cross-sectional view of aspects of a stack 100 of semiconductor dies, illustrating example wire bond design rules, is shown. Stack 100 includes semiconductor dies 102 and 104. Dies 102 and 104 are stacked vertically (in the "Z" direction), and are "shingle stacked" with edges at a minimum edge offset 106 (in the "X" direction). Dies 102 and 104 are semiconductor dies on or within which circuits are fabricated. In some implementations, die 102 is attached to die 104 with an adhesive, such as a die-attach film (DAF), or other suitable material. Dies 102 and 104 each have a thickness 108 in this example (including the thickness of an adhesive layer, if present), however it is noted that in some implementations dies 102 and 104 may have different thicknesses.

Wire bond pad 110 is disposed on die 102, and wire bond pad 112 is disposed on die 104. Wire bond pads 110 and 112 are metal features that are plated, deposited, etched, or otherwise provided or disposed on the top surfaces (in the "Z" direction) of dies 102 and 104 respectively. Wire bond pads 110 and 112 may include any metal or other electrically conductive material suitable for attachment to a typical wire used in wire bonding, such as gold, copper, aluminum, palladium, and so forth, or alloys or layers of any such materials, such as copper/nickel/gold or copper/nickel/palladium/gold alloys.

Wire bond pad 110 is disposed on the top surface of die 102 such that the center (in the "X" direction) of wire bond pad 110 is located a distance 114 from the proximal edge of die 102, and such that the center (in the "X" direction) of wire bond pad 110 is disposed a distance 116 from the proximal edge of die 104.

Distance 114 typically is determined at the die foundry based on the process used to fabricate the die. Distance 116 may be determined by the assembly house at the time the dies are packaged (i.e., stacked), based, among other things, on an amount of clearance required for a wire bonding apparatus, as further discussed below.

Wire bond pad 112 is disposed on the top surface of die 104 such that the center (in the "X" direction) of wire bond pad 112 is disposed a distance 114 from the edge of die 102. Wire bond pads 110 and 112 are disposed the same distance 114 from their respective die edges in this example; however they can have different distances in other implementations. Wire bond pad 110 has a height 118 (in the "Z" direction) above the top surface of die 102, and wire bond pad 112 has a height 120 above die 104. Wire bond pads 110 and 112 each have a minimum area (in the "X-Y" plane), which may be constrained by the wire bonding process (e.g., the capabilities and dimensions of a wire bonding device).

Wire bond pad 110 is connected to wire bond pad 112 with a bond wire 122. Wire bonding capillary 124 is used to attach the wire 122 to wire bond pads 110 and 112, as shown. Wire 122 has a minimum loop height 126 above die 104, and a minimum clearance 128 from the edge of die 104. Capillary 124 dispenses wire 122 and may be configured to create attachments (e.g., ball bonds and/or stitch bonds) to wire bond pads such as wire bond pads 110, 112. The attachments have a ball height 130. Capillary 124 has a taper angle (e.g., main taper angle or bottleneck angle) 132. Taper angle 132 impacts the diameter of capillary 124 at certain points. The diameter of capillary 124 impacts an amount of clearance required for performing wire bonding operations. Wire 122 conducts electricity between circuitry implemented on or within dies 102 and 104.

In some cases, combinations of the various dimensions shown and described with respect to FIG. 1 limit the minimum edge offset 106 to dimensions that permit enough clearance for capillary 124 to attach wire 122 to wire bond pads 110 and 112 without contacting the edge of die 104. In some cases, the minimum edge offset 106 is limited to dimensions that permit wire 122 to be attached with minimum loop height 126 and/or ball height 130. In some cases, a minimum horizontal (i.e., in the "X" direction) distance 114 is also required for the operation of capillary 124.

Because dies 102, 104 are stacked vertically at a minimum edge offset 106 in the horizontal direction, the minimum edge offset 106 impacts the minimum horizontal area of the total stacked die package. Accordingly, some implementations have the advantage of reducing the minimum edge offset 106.

In some implementations, the shingle stack is extended by stacking further dies (e.g., on top of die 104) with edges at the same offset (e.g., edge offset 106). For example, two more dies can be stacked in this way to create a four-die staircase. In some implementations, the shingle stack is repeated to extend the stack; e.g., by stacking repeats of stack 100 in the same footprint as stack 100 (e.g., stacking two more dies on top of die 104 with edges of each of the two additional dies aligned with the edges of die 102 and 104 respectively. For example, two more dies can be stacked in this way to create a stack of two two-die staircases. In some implementations, the shingle stack is both extended and repeated; e.g., by stacking further dies (e.g., on top of die 104) with edges at the same offset (e.g., offset 106), and then stacking repeats of the combined stack to extend the stack. For example, to more dies can be stacked to create a four-die staircase, and then a second four-die staircase can be stacked to create a stack of two four-die staircases.

In some such extended implementations (e.g., four-die staircase, two two-die staircases, two four-die staircases, etc.), the minimum edge offset 106 impacts the minimum horizontal area of the total stacked die package because dies 102, 104 are stacked vertically at a minimum edge offset 106 in the horizontal direction. Accordingly, some such implementations have the advantage of reducing the minimum edge offset 106.

Figure 2:
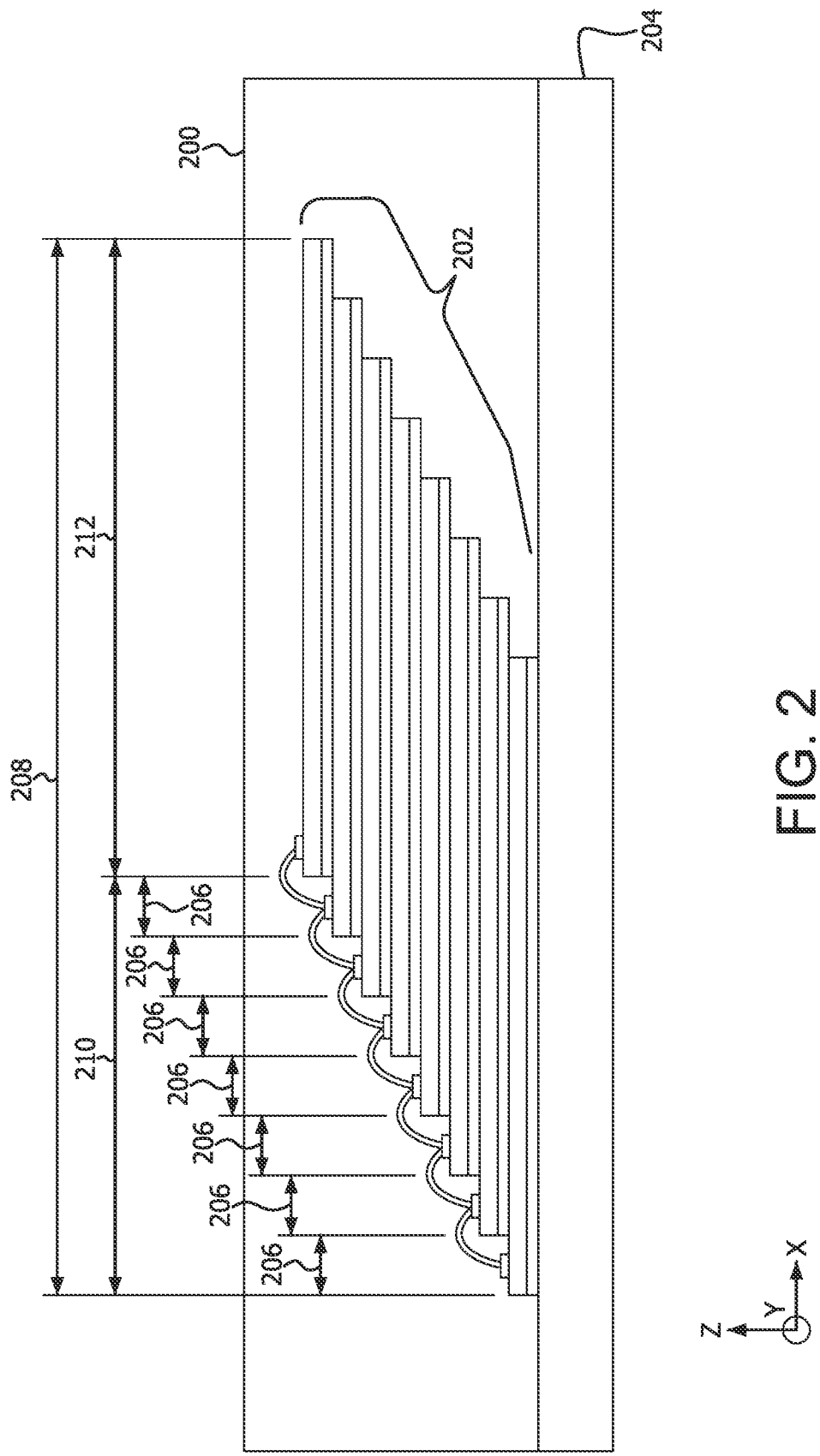
FIG. 2 is a cross-sectional view of a 3D package, illustrating a plurality of stacked dies on a substrate and corresponding wire bond pads.

Referring now to FIG. 2, a cross-sectional view of a 3D package 200 is shown, which includes a plurality of stacked dies 202 on a substrate 204, and corresponding wire bond pads, according to the design rules shown and described with respect to FIG. 1.

Each of the stacked dies 202 includes a wire bonding pad and has a minimum edge offset 206 from its next higher adjacent die or dies; e.g., to allow clearance for a wire bonding capillary (e.g., wire bonding capillary 124 as shown and described with respect to FIG. 1) to attach a bond wire between wire bonding pads disposed in the edge offsets of the dies as shown. The combined offsets 206 of all of stacked dies 202 increases the horizontal dimension 208 of the die stack by a total horizontal edge offset 210 beyond the horizontal dimension 212 of a single stacked die 202.

In some implementations, because each horizontal edge offset 206 is a combination of a minimum clearance of the bonding pad from the edge of the die upon which it is disposed (e.g., distance 114 as shown and described with respect to FIG. 1) and a minimum clearance of the bonding pad from the edge of its next higher adjacent die (e.g., distance 116 as shown and described with respect to FIG. 1), a reduction in either or both of these dimensions has the effect of reducing each of offsets 206. Reducing each of offsets 206, in turn, reduces the total horizontal edge offset 210, and accordingly, horizontal dimension 208. In some cases, this has the advantage of reducing the total horizontal area of the stacked dies 202 and 3D package 200.

Figure 3:
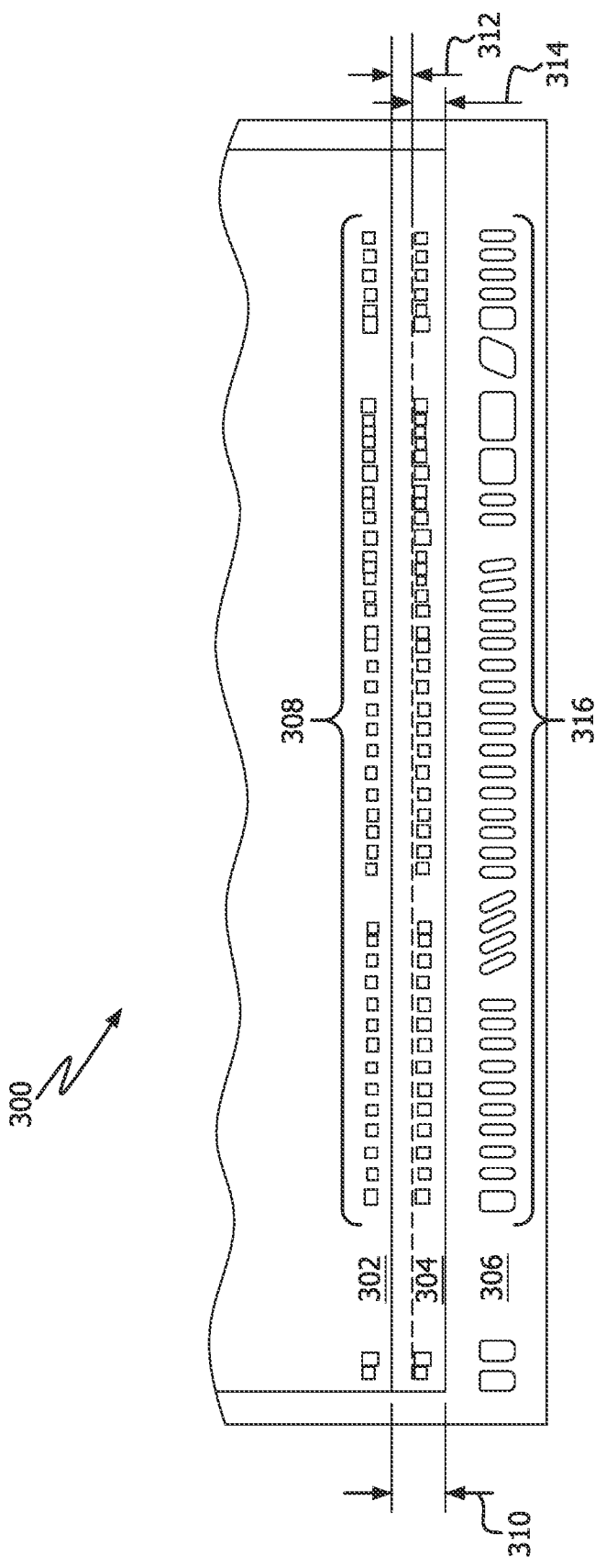
FIG. 3 is a partial plan view of a 3D package, illustrating two stacked dies on a substrate and a plurality of wire bond pads.

Referring now to FIG. 3, a partial plan view of a 3D package 300 is shown. 3D package 300 includes a semiconductor die 302 stacked on a die 304, which is disposed on a substrate 306. Stacked dies 302 and 304 each include a plurality of wire bond pads 308 disposed along at least one of their edges. For example, wire bond pads 308 are disposed on die 304 at varying distances from the die edge of next higher adjacent stacked die 302. A minimum edge offset 310 (similar to edge offset 106 as shown and described with respect to FIG. 1) between the edges of dies 302 and 304 may be constrained by minimum clearance 312 (similar to horizontal distance 116 as shown and described with respect to FIG. 1) from the edge of die 302; e.g., to accommodate the operation of a wire bonding capillary. In some implementations, the edge of die 304 is disposed a minimum horizontal distance 314 from the minimum clearance 312 line (or measured to another suitable point, such as the center of a wire bond pad); e.g., to accommodate the operation of the wire bonding capillary. In some implementations, similar minimum clearances also apply between wire bond pads 316 disposed on substrate 306 and the die edge of die 304.

Figure 4:
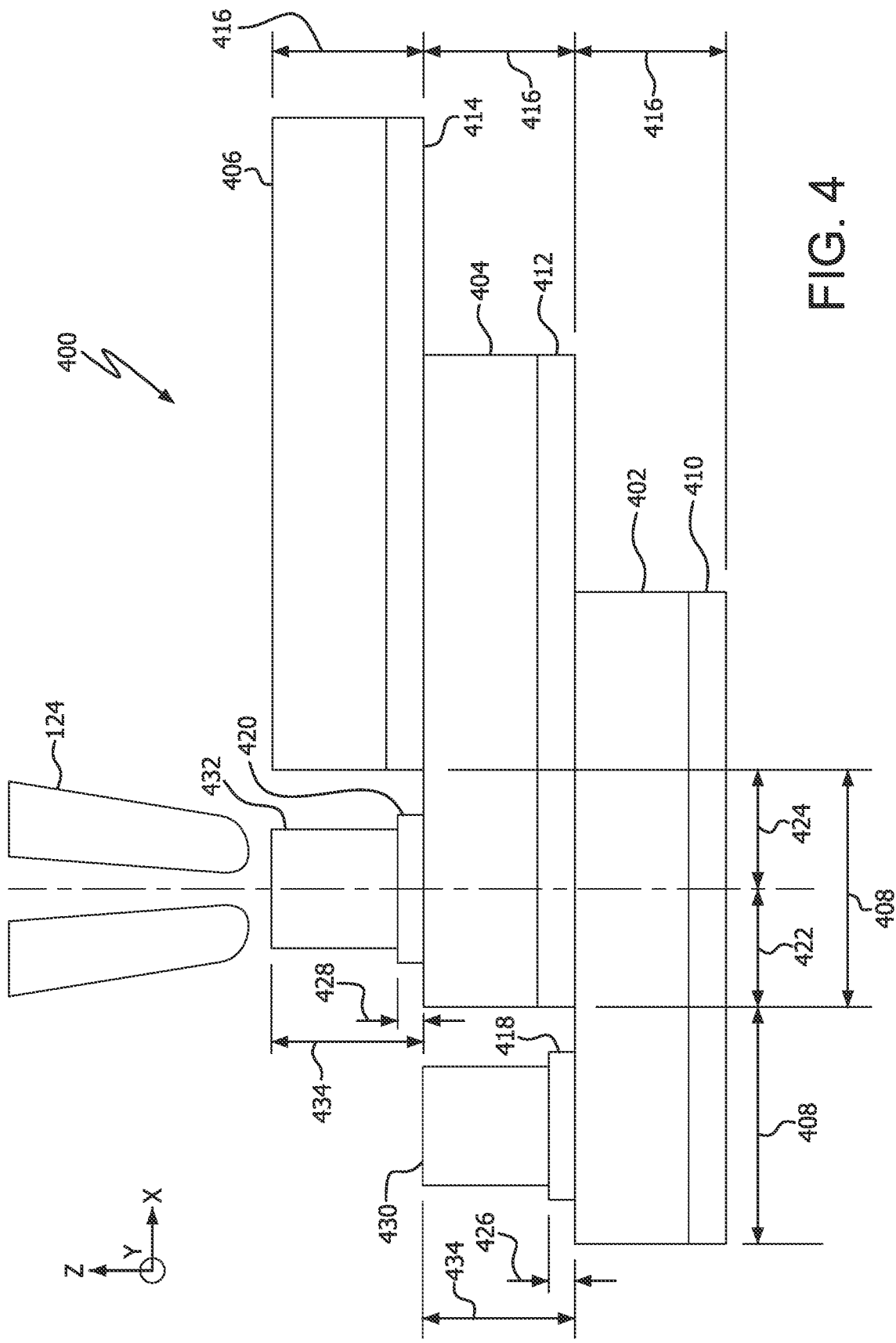
FIG. 4 is an enlarged cross-sectional view of a stack of dies in accordance with one embodiment.

Referring now to FIG. 4, a cross-sectional view of a stack 400 of dies is shown, illustrating example wire bond design rules for an example wire bond pillar structure. In some implementations, the example pillar can be added to an existing wire bond pad in order to provide improved stacking dimensions and reduced 3D packaging area.

Stack 400 includes stacked dies 402, 404, and 406. Dies 402, 404, 406 are stacked vertically (i.e., in the Z direction), with edges at a minimum edge offset 408. Dies 402, 404, 406 are semiconductor dies on or within which circuits are fabricated, for example NAND memory circuits. In some implementations, dies 402, 404, 406 are attached to adjacent dies and/or substrates with adhesives 410, 412, 414. In some implementations, adhesives 410, 412, 414 include a die-attach film (DAF), or other suitable material. Die 402 and adhesive 410 have a combined thickness 416. Dies 404 and 406 and DAFs 412 and 414 also have respective combined thicknesses of 416 in this example. However, in some implementations, dies 402, 404, 406 may have different thicknesses.

Die 402 includes a wire bond pad 418, and die 404 includes a wire bond pad 420. Wire bond pads 418 and 420 are metal features that are plated, deposited, etched, or otherwise provided or disposed on the top surfaces of dies 402 and 404 respectively, and which conduct electricity (i.e., signals, power or ground) between circuitry implemented on or within the dies 402 and 404 when wire bond pads 418 and 420 are electrically connected, such as with a bond wire. Wire bond pads 418 and 420 may include any metal or other electrically conductive material suitable for attachment to a typical bond wire, or to additional conductive materials, or materials used to build up the height of wire bond pads 418 and 420, such as gold, copper, aluminum, palladium, and so forth, or alloys of any such materials.

Wire bond pad 420 is disposed on the top surface of die 404 such that the center (in the "X" direction) of wire bond pad 420 is disposed a horizontal distance 422 from the edge of die 404, and such that the center (in the "X" direction) of wire bond pad 420 is disposed a horizontal distance 424 from the edge of die 406. Corresponding dimensions also apply to wire bond pad 418.

Wire bond pad 418 has a height 426 above the top surface of die 402, and wire bond pad 420 has a height 428 above die 404. The heights 426 and 428 may vary from, for example, 0 to 50 microns. A pillar 430 is plated, deposited, or otherwise formed on wire bond pad 418. Similarly, pillar 432 is plated, deposited, or otherwise formed on wire bond pad 420. Pillars 430 and 432 may include any metal or other electrically conductive material suitable for attachment to a typical bond wire, such as gold, copper, aluminum, and palladium, or alloys of any such materials. In some embodiments, pillars 430 and 432 have a cylindrical shape (e.g., have a circular cross section in the Z direction), a prismatic shape (e.g., have a square or rectangular cross section in the Z direction), or any other suitable geometry. In some embodiments, pillars 430 and 432 are formed by stacking balls formed by a wire bond capillary.

Wire bond pad 418 and pillar 430 have a combined vertical height 434 above the top surface of die 402. Similarly, wire bond pad 420 and pillar 432 have a combined vertical height 434 above the top surface of die 404. In this example, combined height 434 is greater than or equal to combined thickness 416. In some implementations, pillars 430 and 432 have columnar structures. In some implementations, pillars 430 and 432 are cylindrical, or substantially cylindrical, with an axis in the vertical direction with respect to the 3D package 400 (i.e., in the direction of combined height 434). In some implementations, wire bond pads 418 and 420 are fabricated to have a vertical dimension equal to combined height 434, such that it may be unnecessary to add a pillar to raise the height of wire bond pads 418 and 420 to the same vertical dimension as combined height 434. In some implementations, a bonding surface on the top of pillar 430 is level with the top of die 404, or with the top of wire bond pad 420.

Because the combined height 434 of wire bonding pad 420 and pillar 432 is equal to (or greater than) the combined thickness 416 of die 406, horizontal distance 424 is not constrained to provide clearance between wire bonding capillary 124 and the die edge of die 406. Accordingly, horizontal distance 424 may be relatively shorter than horizontal distance 116 (as shown and described with respect to FIG. 1).

Figure 5:
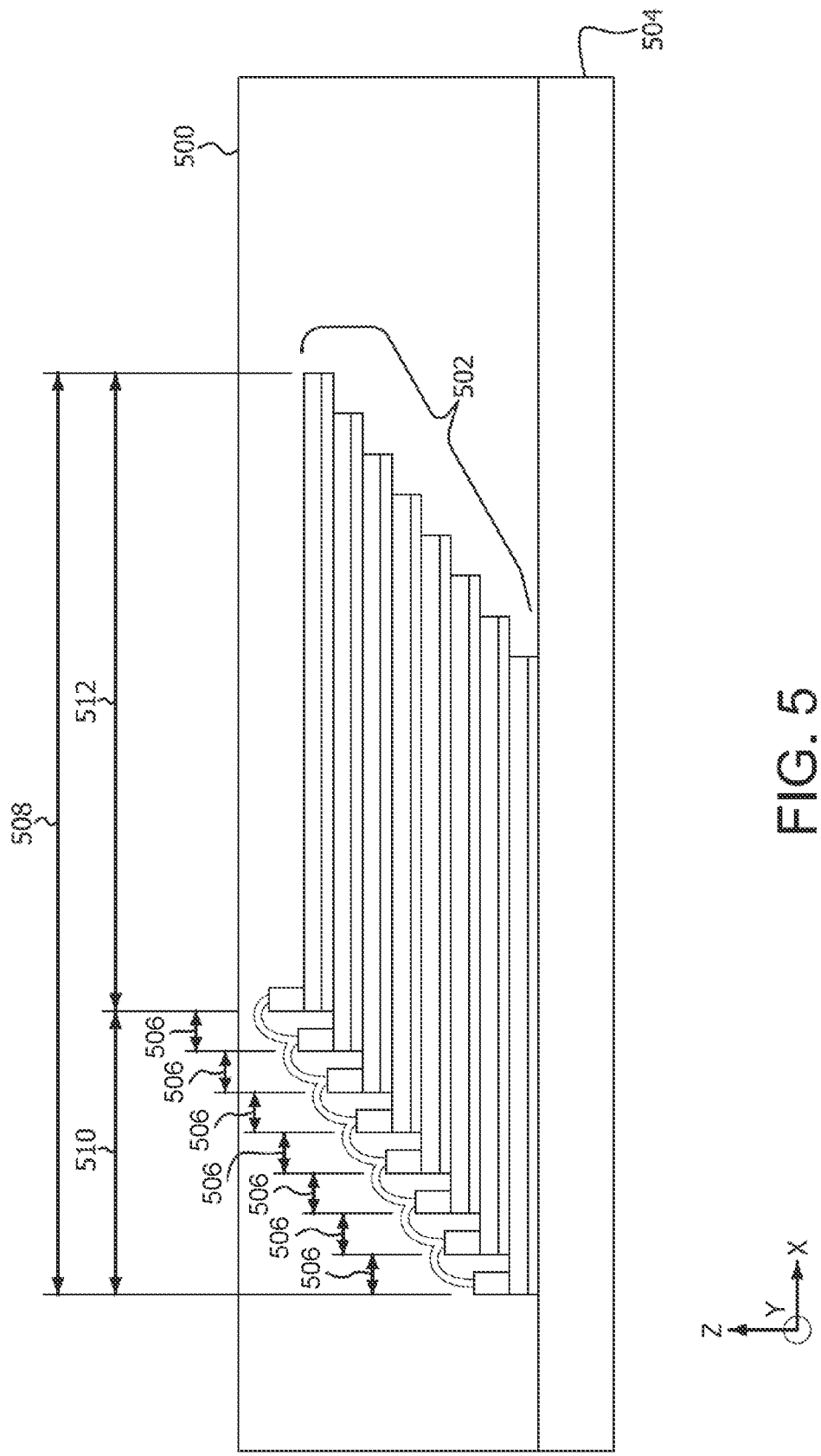
FIG. 5 is a cross-sectional view of a 3D package, illustrating a plurality of stacked dies on a substrate and corresponding wire bond structures.

Referring now to FIG. 5, a cross-sectional view of a 3D package 500 is shown, which includes a plurality of stacked dies 502 on a substrate 504, and corresponding wire bond pads with added pillar structures, according to the design rules shown and described with respect to FIG. 4.

Each of the plurality of stacked dies 502 includes a wire bonding pad with a pillar added (e.g., as shown and described with respect to FIG. 4) to bring the combined height of the wire bond pad and pillar to the level of the top surface of the next higher adjacent die. Accordingly, each of the plurality of stacked dies 502 is disposed at a minimum edge offset 506 from its next higher adjacent die or dies, which does not need to allow clearance for a wire bonding capillary to attach a bond wire between wire bonding pads disposed in the edge offsets of the dies as shown. The combined offsets 506 of all of stacked dies 502 increases the horizontal dimension 508 of the plurality of stacked dies 502 by a total horizontal edge offset 510 beyond the horizontal dimension 512 of a single one of stacked dies 502.

In some implementations, the elimination of a minimum clearance to accommodate a wire bonding capillary facilitates a reduction in the minimum clearance of the bonding pad from the edge of its next higher adjacent die (e.g., distance 116 as shown and described with respect to FIG. 1).

Because each horizontal edge offset 506 is a combination of a minimum clearance of the bonding pad from the edge of the die upon which it is disposed and a minimum clearance of the bonding pad from the edge of its next higher adjacent die (e.g., distance 116 as shown and described with respect to FIG. 1), a reduction in either or both of these dimensions has the effect of reducing each of offsets 506, and accordingly, the total horizontal edge offset 510, and horizontal dimension 508 of the plurality of stacked dies 502, as compared with 3D package 200 shown and described with respect to FIG. 2. In some cases, this has the advantage of reducing the total horizontal area of the plurality of stacked dies 502 and 3D package 500.

Figure 6:
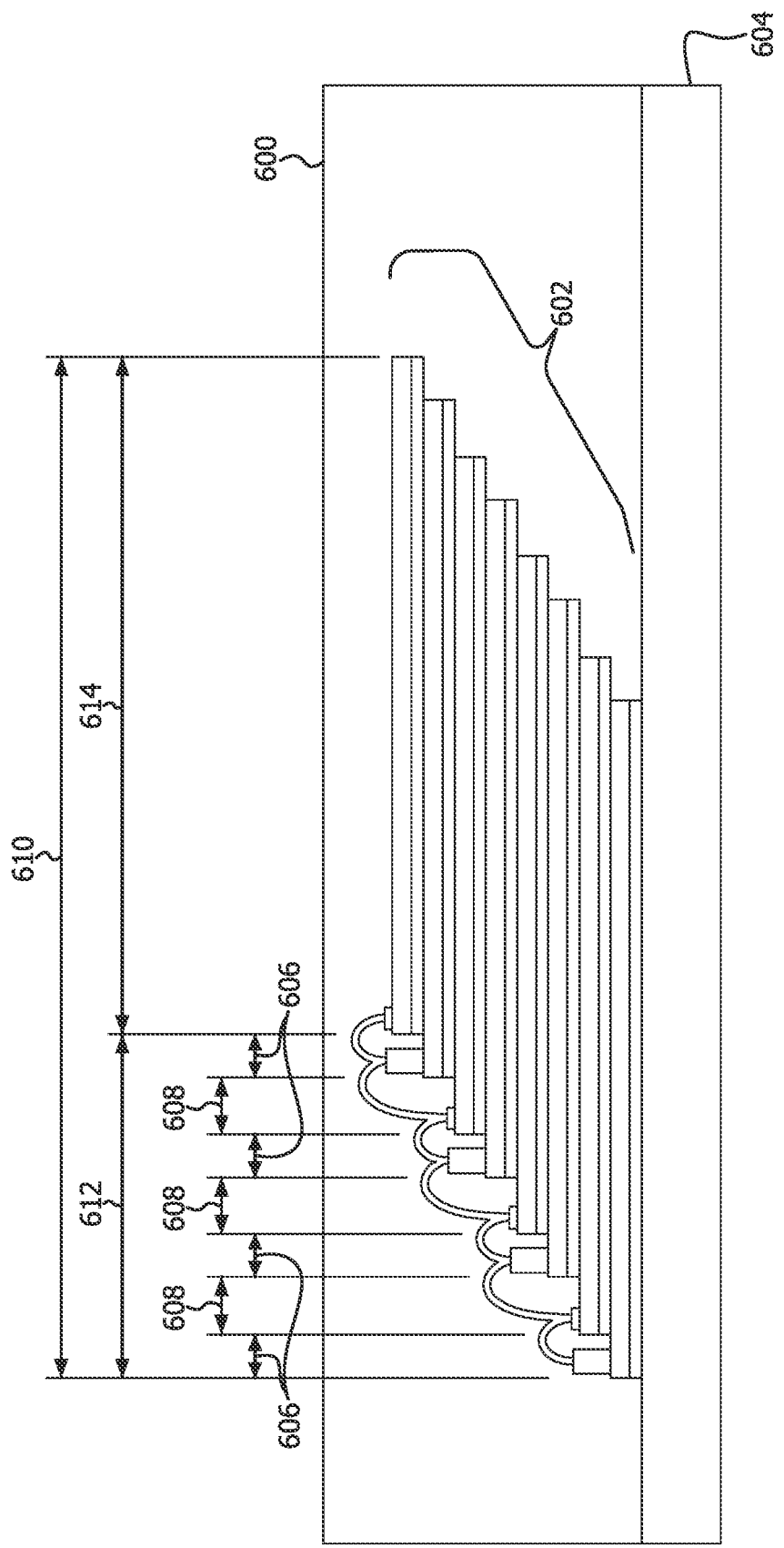
FIG. 6 is a cross-sectional view of a 3D package, illustrating a plurality of stacked dies on a substrate and corresponding wire bond pads and wire bond structures.

Referring now to FIG. 6, a cross-sectional view of a 3D package 600 is shown, which includes a plurality of stacked dies 602 on a substrate 604, and corresponding wire bond pads, some of which have added pillar structures, according to both the design rules shown and described with respect to FIG. 1, and FIG. 4, on different dies. That is, alternate dies in the stack include pillars formed on their bond pads.

Each of the stacked dies 602 includes a wire bonding pad (e.g., as shown and described with respect to FIG. 1), and alternating ones of the stacked dies 602 has a pillar added to the wire bonding pad (e.g., as shown and described with respect to FIG. 4) to bring the combined height of the wire bond pad and pillar to the level of the top surface of the next higher adjacent die. Those stacked dies 602 that include a pillar are disposed at a minimum edge offset 606 from its next higher adjacent die, which does not need to allow clearance for a wire bonding capillary, whereas those stacked dies 602 that do not include a pillar are disposed at a minimum edge offset 608 from its next higher adjacent die, which is greater than minimum edge offset 606 and allows clearance for the wire bonding capillary or other wire bonding apparatus.

The combined offsets 606, 608 of all of stacked dies 602 increases the horizontal dimension 610 of the plurality of stacked dies 602 by a total horizontal edge offset 612 beyond the horizontal dimension 614 of a single one of stacked dies 602.

In some implementations, the elimination of a minimum wire bonding capillary clearance, in a subset of stacked dies 602, facilitates a reduction in the minimum clearance of the bonding pad from the edge of its next higher adjacent die (e.g., distance 116 as shown and described with respect to FIG. 1).

Because each horizontal edge offset 606 is a combination of a minimum clearance of the bonding pad from the edge of the die upon which it is disposed (e.g., distance 114 as shown and described with respect to FIG. 1) and a minimum clearance of the bonding pad from the edge of its next higher adjacent die (e.g., distance 116 as shown and described with respect to FIG. 1), a decrease in either or both of these dimensions has the effect of reducing each of offsets 606. Accordingly, the total horizontal edge offset 612, and horizontal dimension 610 of the plurality of stacked dies 602, is reduced as compared with 3D package 200 shown and described with respect to FIG. 2. In some cases, this has the advantage of reducing the total horizontal area of the plurality of stacked dies 602 and 3D package 600 as compared with the plurality of stacked dies 202 and 3D package 200.

In the examples of FIG. 4, FIG. 5, and FIG. 6 above, a pillar structure is added to a wire bonding pad on a die to reduce or eliminate a minimum clearance of the bonding pad from the edge of the next higher adjacent die (e.g., distance 116 as shown and described with respect to FIG. 1). Both the addition of the pillar and the stacking of the dies are performed after fabrication of the dies (e.g., during 3D packaging) and the minimum clearance of the bonding pad from the edge of the next higher adjacent die can be adjusted during that process. In some implementations however, the pillar also permits reduction in the minimum clearance of the bonding pad from the edge of its die (e.g., distance 114 as shown and described with respect to FIG. 1). The distance to the bonding pad from the edge of its die is determined during fabrication of the dies, and is fixed after the dies are diced from the wafer. Nevertheless, it may be desired to reduce the distance to the bonding pad from the edge of its die in order to further reduce the total horizontal edge offset of each die in the stack.

FIGS. 7A-B, 8A-B, and 9A-B illustrate example approaches to reducing the distance to the bonding pad from the edge of its die using redistribution layer (RDL) techniques.

Figure 7A:
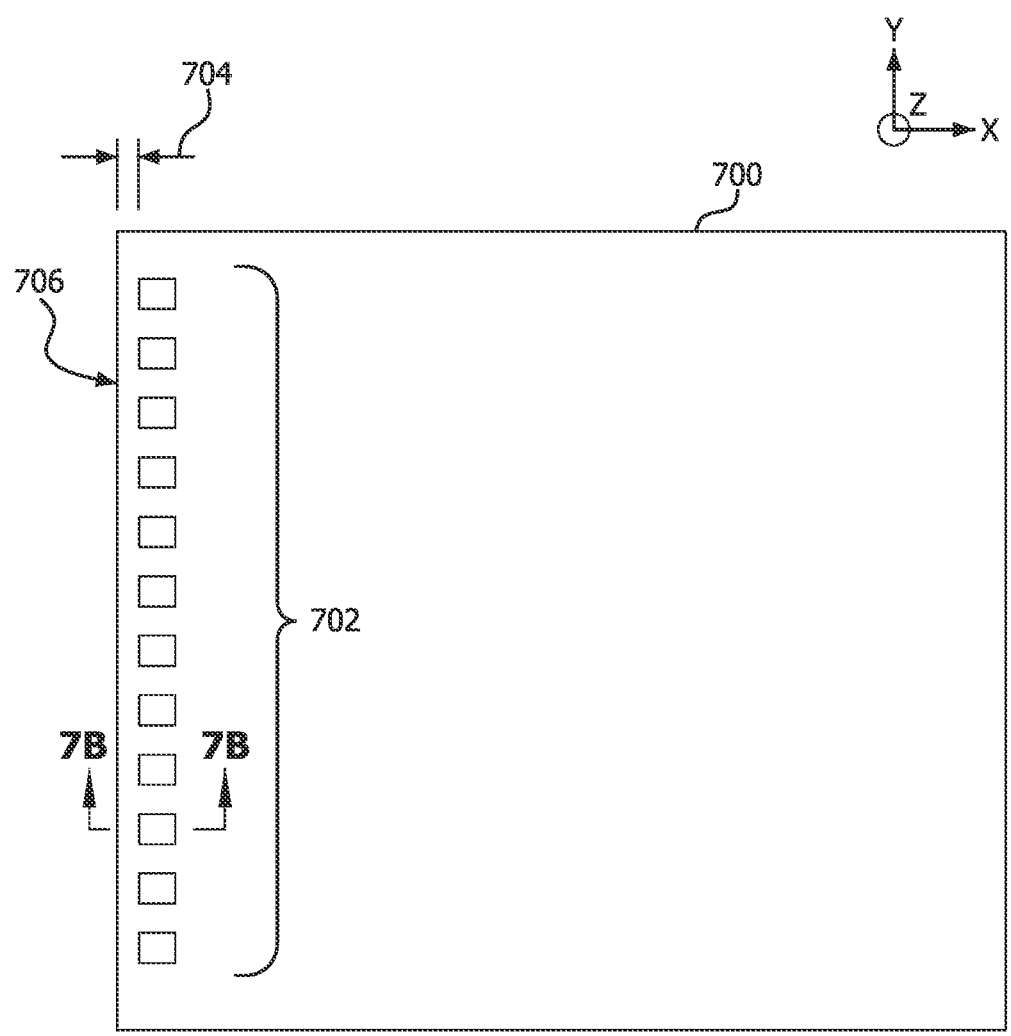
FIG. 7A is a plan view of a semiconductor die, illustrating wire bond pads at an example distance from an edge of the die.

Referring now to FIG. 7A, a plan view of a semiconductor die 700 is shown, which includes a plurality of wire bond pads 702 at a distance 704 from an edge 706 of die 700, prior to the addition of pillar structures to wire bond pads 702. In this example, distance 704 is equal to the minimum allowable distance from edge 706 for wire bonding with an added pillar, as shown and described with respect to FIG. 4

Figure 7B:
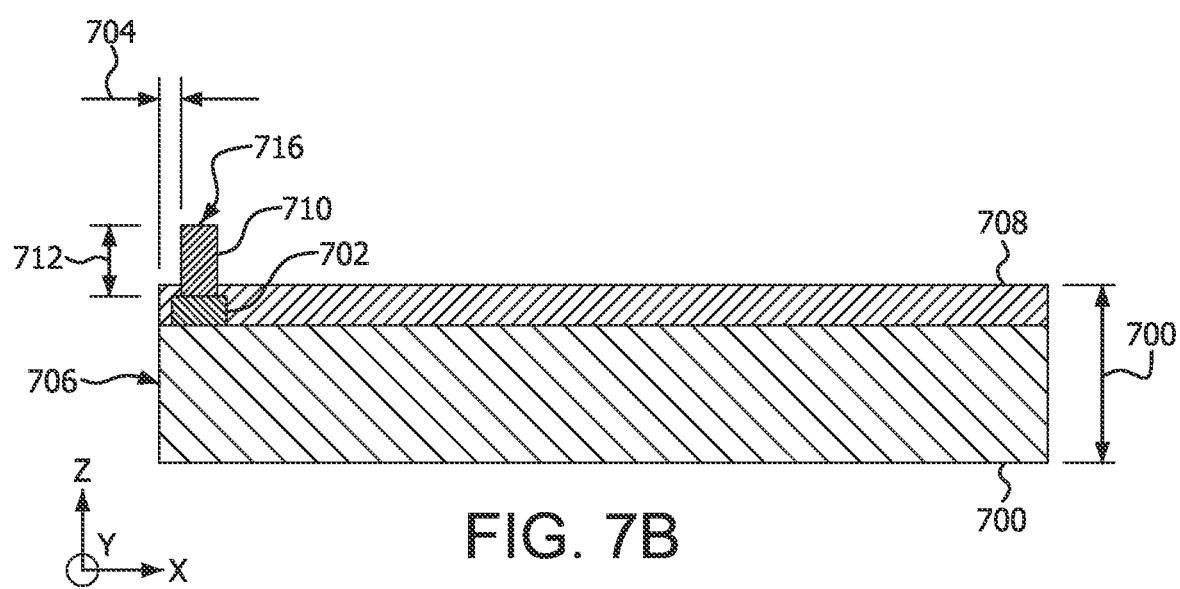
FIG. 7B is a cross-sectional view of the die shown in FIG. 7A, illustrating aspects of example wire bond structures disposed on the wire bond pads.

Referring now to FIG. 7B, a cross-sectional view of die 700 and wire bond pad 702, as shown in FIG. 7A, is shown. A dielectric layer 708 is deposited on top of die 700 with an opening which exposes a portion of wire bond pad 702 for deposition of a pillar 710. Pillar 710 has a height 712 above the dielectric layer 708 that is equal to the combined thickness 714 of die 700, dielectric layer 708, and any adhesive layer, such that the wire bonding surface 716 of pillar 710 is level with the top surface (e.g., a dielectric layer) of the next higher adjacent die in the 3D stack (assuming that the next higher adjacent die also has the same combined thickness 714).

Because distance 704 is already at the minimum distance for wire bonding with pillar 710, pillar 710 is formed directly on top of wire bond pad 702 without the need for a redistribution layer.

Figure 8A:
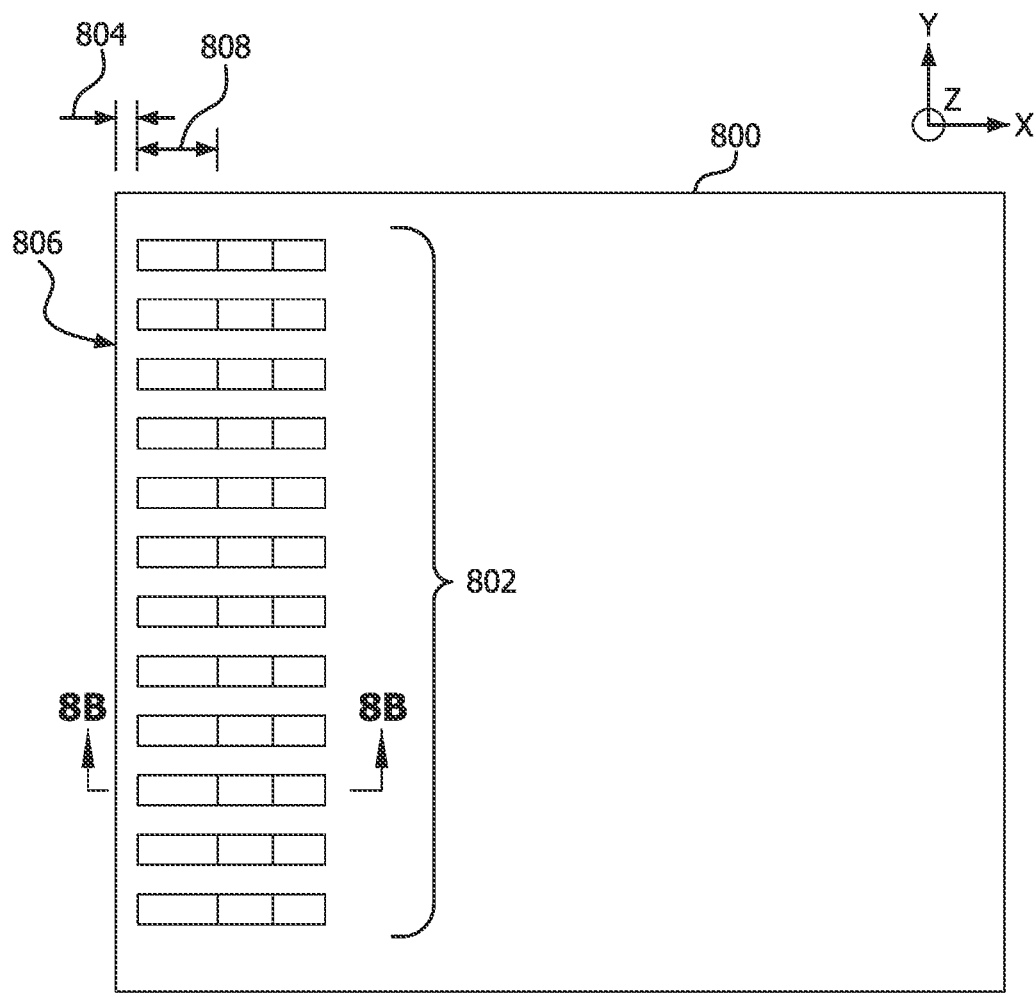
FIG. 8A is a plan view of a semiconductor die, illustrating wire bond pads at another example distance from an edge of the die.

Referring now to FIG. 8A, a plan view of a die 800 is shown, which includes a plurality of wire bond pads 802 at a distance 804 from an edge 806 of die 800, prior to the addition of pillar structures to wire bond pads 802 or elsewhere on die 800. In this example, distance 802 is greater than the minimum allowable distance from edge 806 for wire bonding with an added pillar, as shown and described with respect to FIG. 4, and is also greater than the dimension 808 of wire bond pads 802 in the direction perpendicular to edge 806.

Figure 8B:
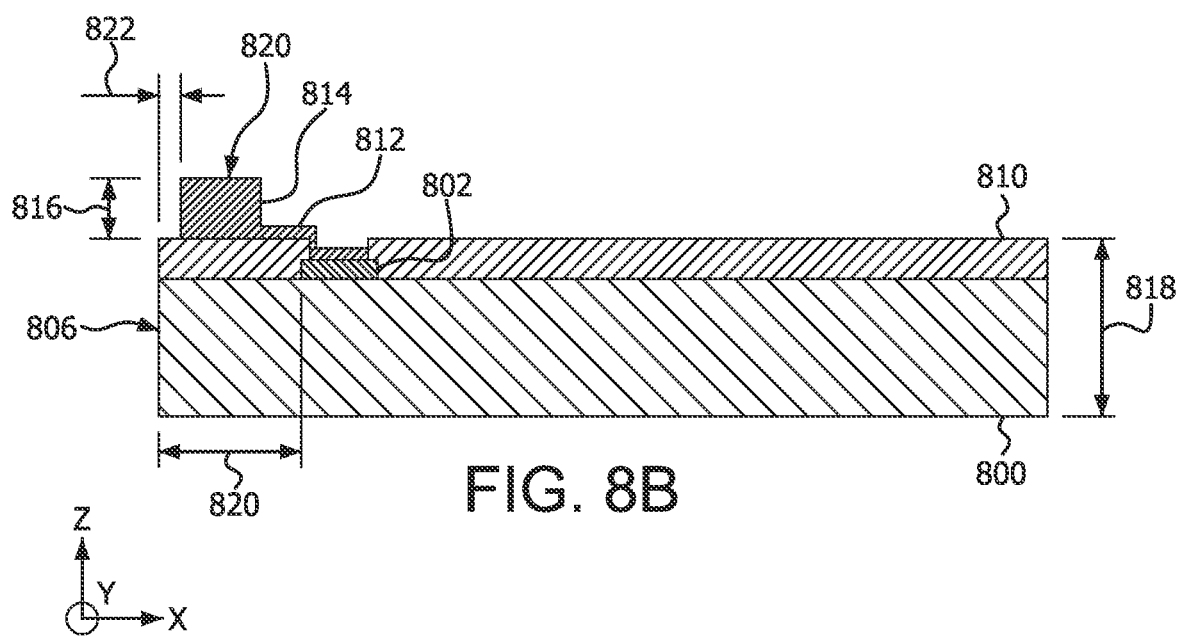
FIG. 8B is a cross-sectional view of the die shown in FIG. 8A, illustrating aspects of example wire bond structures disposed partially on the wire bond pads and partially on a redistribution layer (RDL) that is deposited on the wire bond pads.

Referring now to FIG. 8B, a cross-sectional view of die 800 and wire bond pad 802, as shown in FIG. 8A, is shown. A dielectric layer 810 is deposited on top of die 800 with an opening which exposes a portion of wire bond pad 802 for deposition of a RDL 812. RDL 812 contacts wire bond pad 802 and extends over dielectric layer 810 to minimum allowable distance 804 from edge 806 for wire bonding with an added pillar 814. Pillar 814 has a height 816 above the dielectric layer 810 that is equal to the combined thickness 818 of die 800, dielectric layer 810, and any adhesive layer, such that the wire bonding surface 820 of pillar 814 is level with the top surface (e.g., a dielectric layer) of the next higher adjacent die in the 3D stack (assuming that the next higher adjacent die also has the same combined thickness 818).

Because distance 804 is greater than the minimum distance 822 from die edge 806 for wire bonding with pillar

814, wire bonding structure 814 is located at distance 822 from die edge 806, and is electrically connected to wire bond pad 802 by RDL 812.

Figure 9A:
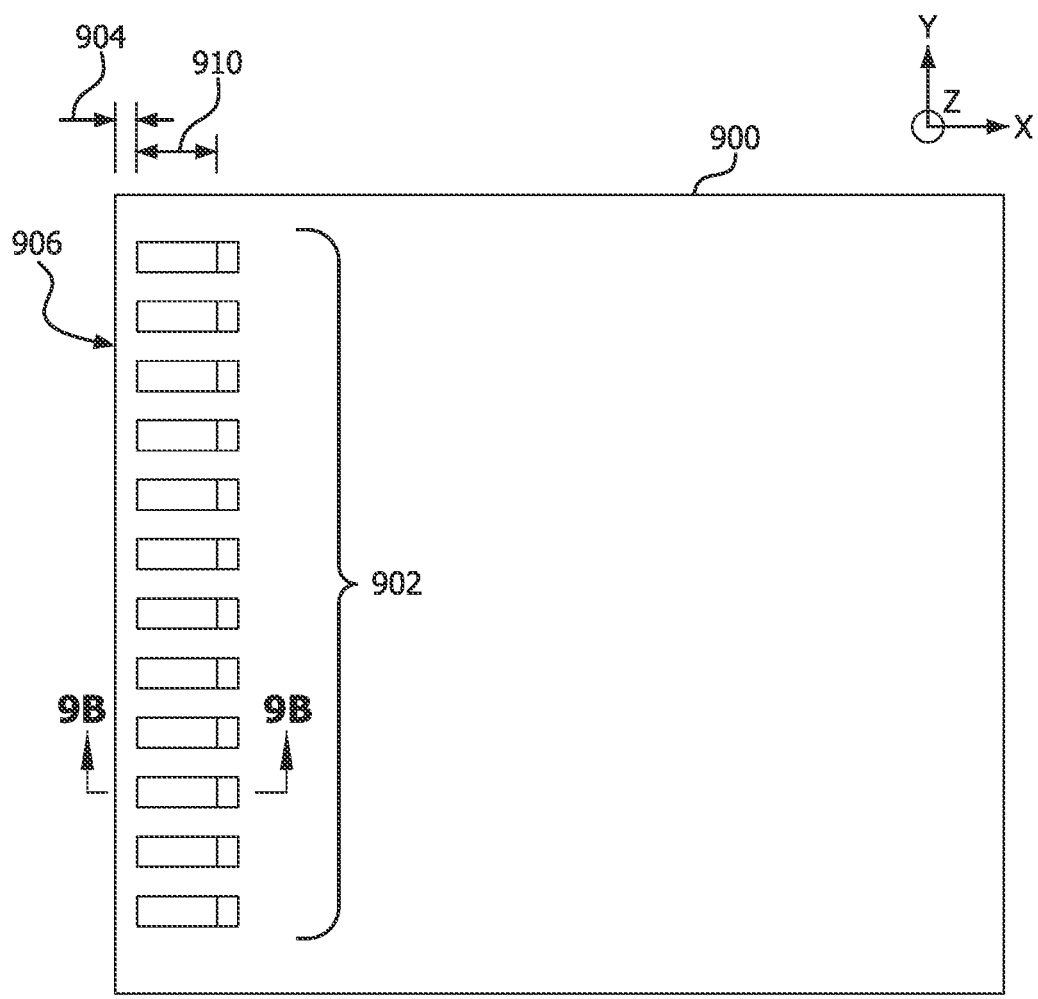
FIG. 9A is a plan view of a semiconductor die, illustrating wire bond pads at another example distance from an edge of the die.

Referring now to FIG. 9A, a plan view of a die 900 is shown, which includes a plurality of wire bond pads 902 at a distance 904 from an edge 906 of die 900, prior to the addition of pillar structures to wire bond pads 902 or elsewhere on die 900. In this example, distance 904 is greater than the minimum allowable distance from edge 906 for wire bonding with an added pillar, as shown and described with respect to FIG. 4, and is less than the dimension 910 of wire bond pads 902 in the direction perpendicular to edge 906.

Figure 9B:
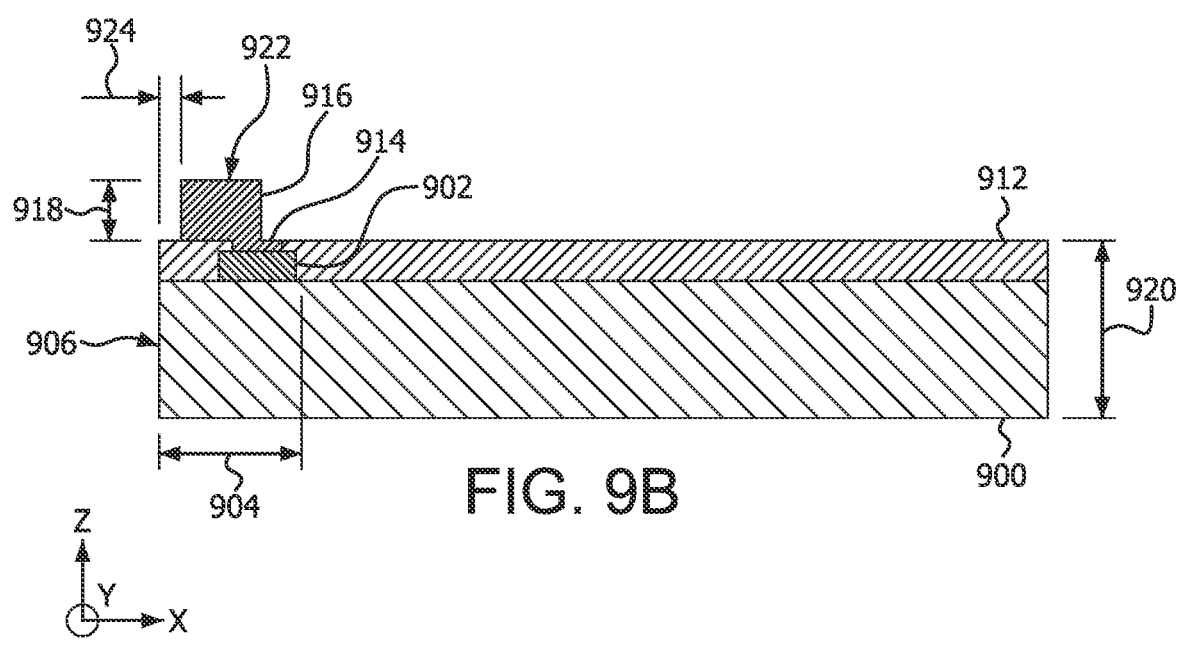
FIG. 9B is a cross-sectional view of the die shown in FIG. 9A, illustrating aspects of example wire bond structures disposed partially on the wire bond pads and partially on a RDL that is deposited on the wire bond pads.

Referring now to FIG. 9B, a cross-sectional view of die 900 and wire bond pad 902, as shown in FIG. 9A, is shown. A dielectric layer 912 is deposited on top of die 900 with an opening which exposes a portion of wire bond pad 902 for deposition of a RDL 914. RDL 914 contacts wire bond pad 902 and is deposited up to the level of dielectric layer 912, but does not extend over dielectric layer 912. Rather, pillar 916 is deposited partially on dielectric layer 912 and partially on (and electrically connected with) RDL 914. Pillar 916 is deposited at minimum allowable distance 904 from edge 906 for wire bonding. Pillar 916 has a height 918 above the dielectric layer 912 that is equal to the combined thickness 920 of die 900, dielectric layer 912, and any adhesive layer, such that the wire bonding surface 922 of pillar 916 is level with the top surface (e.g., a dielectric layer) of the next higher adjacent die in the 3D stack (assuming that the next higher adjacent die also has the same combined thickness 920).

Because distance 904 is greater than the minimum distance 924 from die edge 906 for wire bonding with pillar 916, wire bonding structure 916 is located at distance 924 from die edge 906, and is electrically connected to wire bond pad 902 by RDL 914.

Figure 10A:
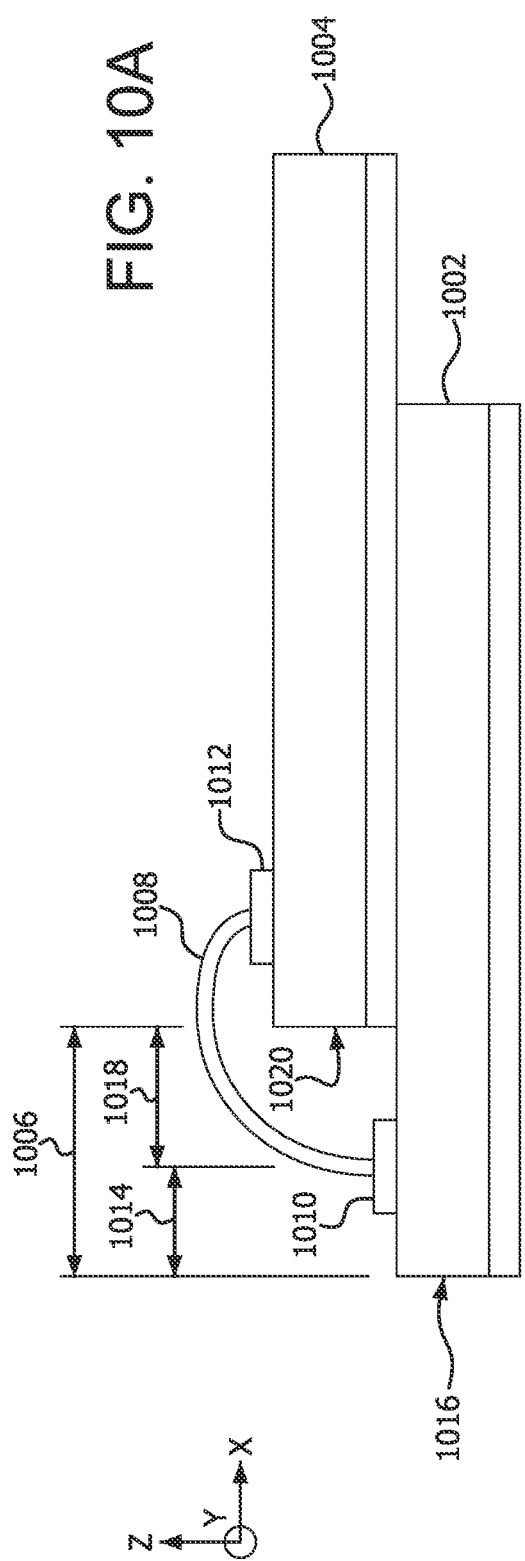
FIG. 10A is a cross-sectional view of two stacked dies, illustrating an example minimum die edge offset for wire bonding using the bonding pad illustrated in FIG. 1.
Figure 10B:
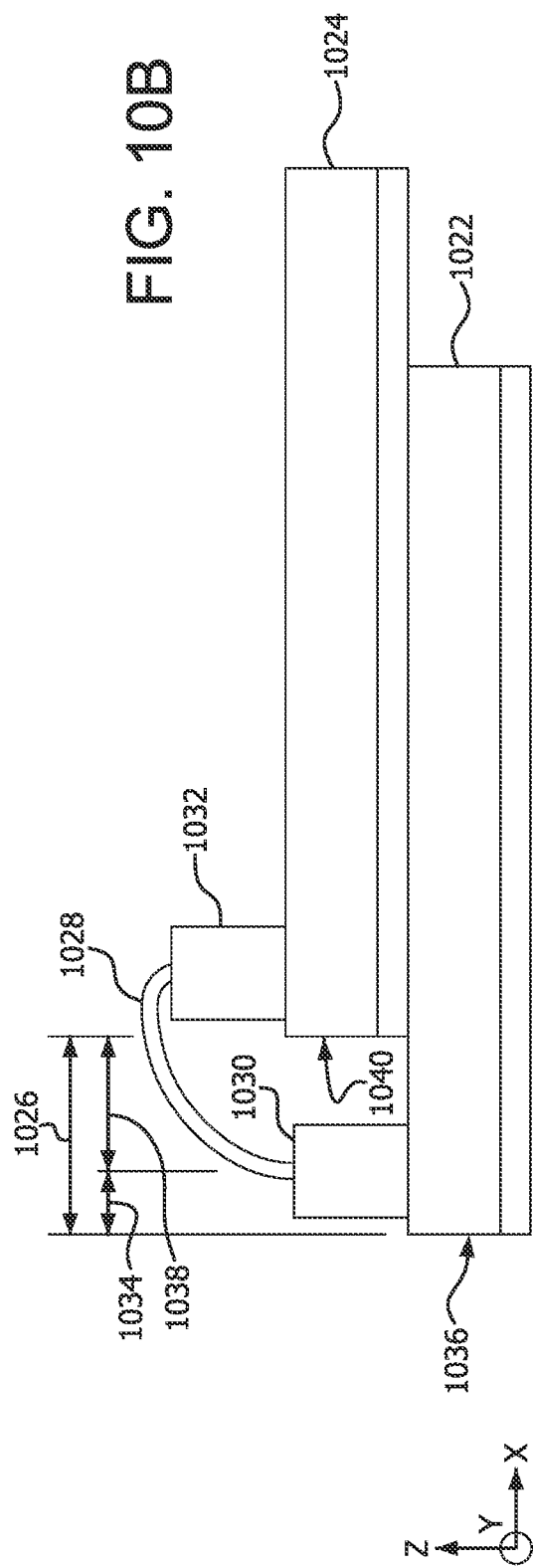
FIG. 10B is a cross-sectional view of two stacked dies, illustrating an example minimum die edge offset for wire bonding using the wire bond structure illustrated in FIG. 4.

The minimum die edge offsets of adjacent stacked dies for wire bonding between wire bonding pads on each adjacent stacked die are greater than the minimum die edge offsets of adjacent stacked dies for wire bonding between wire bonding structures on each adjacent stacked die, as illustrated by FIGS. 10A and 10B.

Referring now to FIG. 10A, a cross-sectional view of two stacked dies 1002 and 1004 is shown, illustrating an example minimum die edge offset 1006 for wire bonding using wire 1008 between wire bond pad 1010 and wire bond pad 1012. Wire bond pad 1010 and wire bond pad 1012 are disposed on die 1002 and die 1004 respectively. Minimum die edge offset 1006 includes horizontal distance 1014 between the center of wire bond pad 1010 and the die edge 1016 of die 1002, and horizontal distance 1018 between the center of wire bond pad 1010 and the die edge 1020 of die 1004.

Horizontal distance 1014 is determined at the foundry based on the size of wire bond pad 1010. Horizontal distance 1018 is determined by the packager at the time dies 1002 and 1004 are packaged (i.e., stacked), based, among other things, on an amount of clearance required for a wire bonding apparatus to access wire bonding pad 1010 without contacting die edge 1020, and to bond wire 1008 with appropriate loop heights and clearances.

Referring now to FIG. 10B, a cross-sectional view of two stacked dies 1022 and 1024 is shown, illustrating an example minimum die edge offset 1026 for wire bonding using wire 1028 between wire bond pillar 1030 and wire bond pillar 1032. Wire bond pillar 1030 and wire bond pillar 1032 are disposed on die 1022 and die 1024 respectively. Minimum die edge offset 1026 includes horizontal distance 1034 between the center of wire bond pillar 1030 and the die edge 1036 of die 1022, and horizontal distance 1038 between the center of wire bond pillar 1030 and the die edge 1040 of die 1024.

Horizontal distance 1034 may be determined, either at the foundry based on the size of wire bond pad 1010, or by the packager or other post-foundry processor based on wire bonding constraints of wire bond pillar 1030 and wire bond pillar 1032. Horizontal distance 1038 is determined by the packager at the time dies 1022 and 1024 are packaged (i.e., stacked), based, among other things, on an amount of clearance required for a wire bonding apparatus such as a capillary to bond wire 1028 between wire bond pillar 1030 and wire bond pillar 1032 with appropriate loop heights and clearances and without contacting the side of wire bond pillar 1032. This clearance is between the center of wire bond pillar 1030 and the side of wire bond pillar 1032, and not between the center of wire bond pillar 1030 and die edge 1040, since the bonding surface of wire bond pillar 1030 is at the same level as the top surface of die 1024 in this example. Accordingly, in this example, the wire bond apparatus needs to clear wire bond pillar 1032 and does not require clearance from die edge 1040.

Comparing FIGS. 10A and 10B, minimum die edge offset 1026 is smaller than minimum die edge offset 1006 due to the smaller horizontal distances 1032, 1038 that are possible due to the addition of wire bond pillars 1030 and 1032.

Figure 11A:
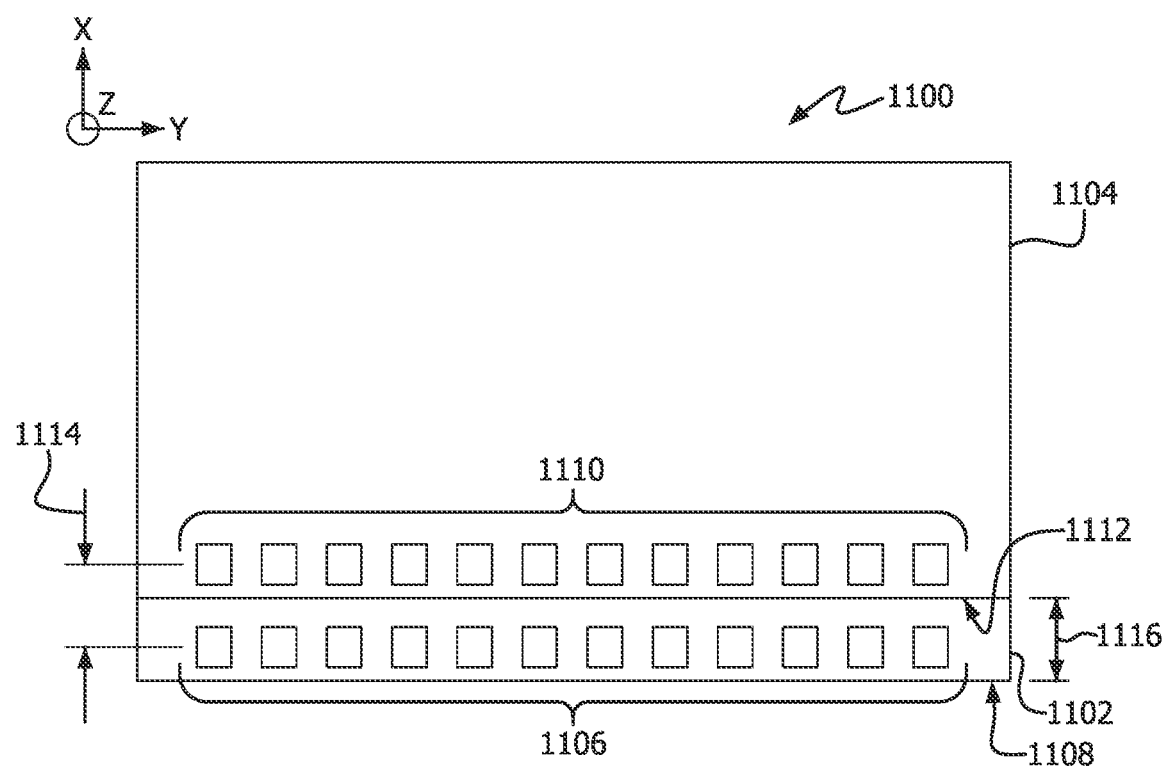
FIG. 11A is a plan view of two stacked dies offset in one direction, illustrating an example wire bonding pad alignment.

Referring now to FIG. 11A, a plan view of aspects of a stack 1100 of two semiconductor dies 1102 and 1104 is shown. Die 1102 includes a plurality of wire bond pillars 1106 disposed along die edge 1108. Die 1104 includes a plurality of wire bond pillars 1110 disposed along die edge 1112.

In this example, a minimum distance 1114 is required between wire bond pillars 1106 and wire bond pillars 1110, e.g., for a wire bonding apparatus (e.g., a wire bonding capillary) to bond wires between wire bond pillars 1106 and wire bond pillars 1110 with appropriate loop heights and clearances and without contacting the side of wire bond pillars 1110.

Minimum distance 1114 is between wire bond pillars 1106 and wire bond pillars 1110, and not between wire bond pillars 1106 and die edge 1112, since the bonding surface of wire bond pillars 1106 are at the same level as the top surface of die 1104 in this example.

Figure 11B:
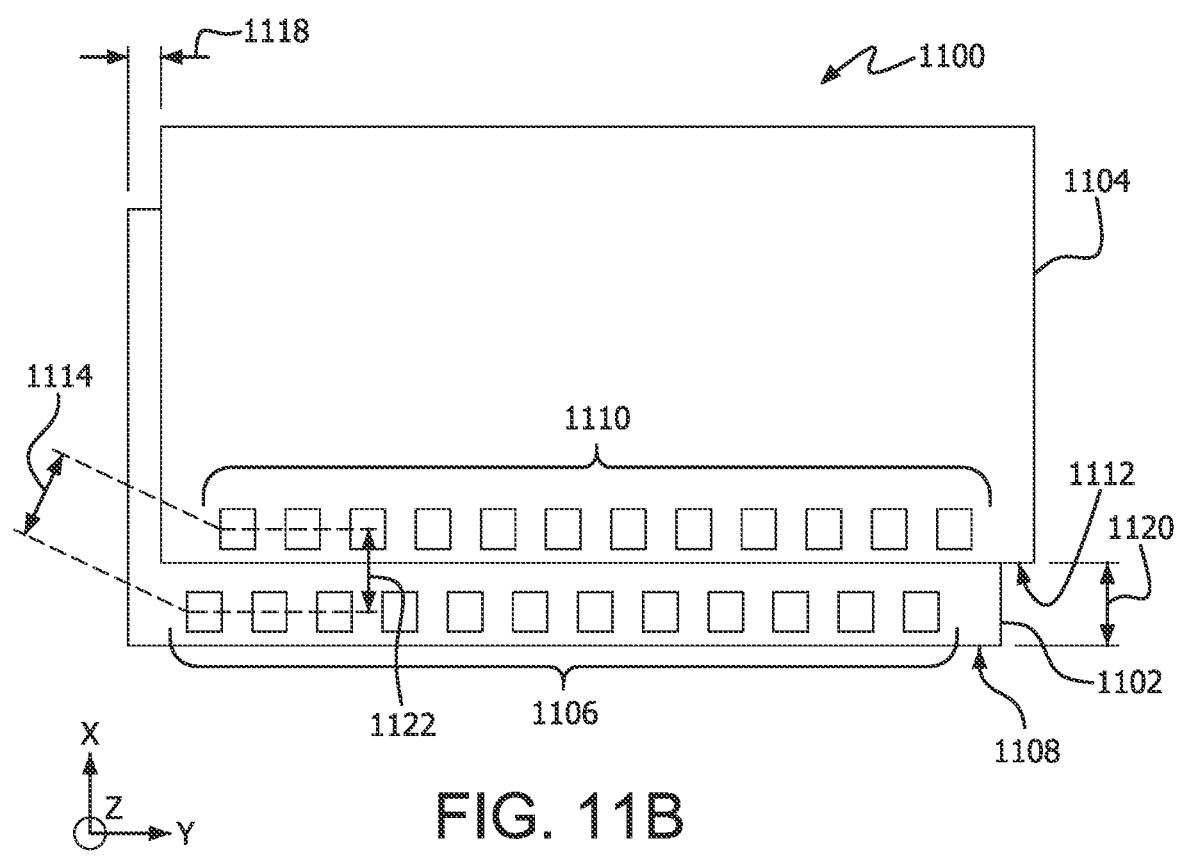
FIG. 11B is a plan view of two stacked dies offset in two directions, illustrating another example wire bonding pad alignment.

Accordingly, in some examples, it may be possible to reduce the minimum horizontal distance 1116 between die edge 1108 and die edge 1112 in the "X" direction by offsetting dies 1102 and 1104 from one another in the "Y" direction FIG. 11B is a plan view of aspects of the top of 3D package 1100 which includes two stacked dies, 1102, 1104. In this example, die 1104 is offset from die 1102 in the "Y" direction by an offset 1118. The minimum clearance 1120 between die edge 1108 and 1112 is reduced in this example from minimum distance 1116, (as shown and described with respect to FIG. 11A). This is possible because while a distance 1122 between wire bond pillars 1106 and 1110 in the "X" direction is less than minimum distance 1114, the minimum distance 1114 is maintained between wire bond pillars 1106 and wire bond pillars 1110 in a direction that is non-perpendicular to die edges 1112 and 1108, due to the introduced offset 1118.

Figure 12:
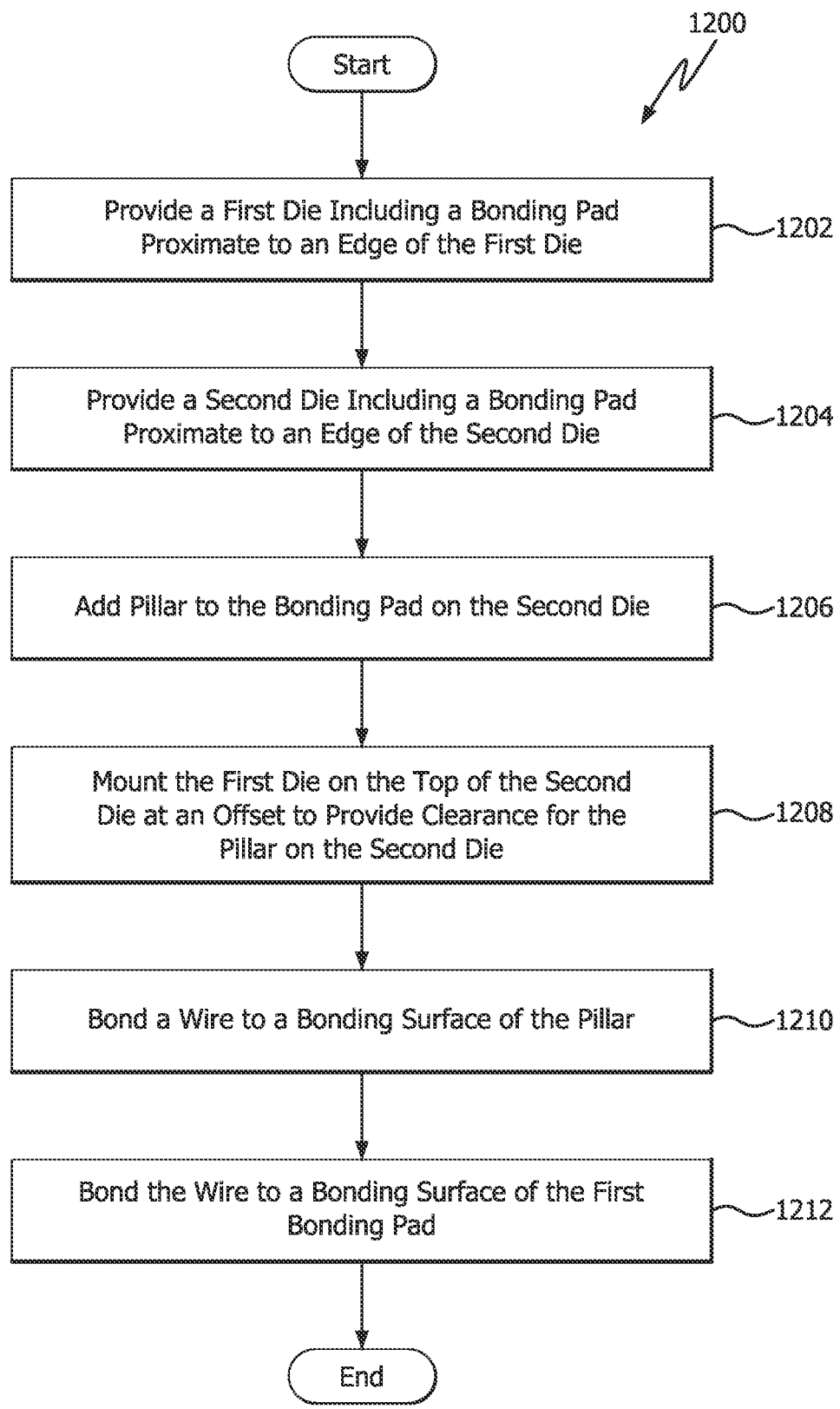
FIG. 12 is a flow chart illustrating an example method for electrically connecting stacked semiconductor dies.

Referring now to FIG. 12, a flow chart illustrating an example method 1200 for electrically connecting stacked semiconductor dies is shown. The various elements of method 1200 are presented in an example order, however these elements can be performed in any suitable order. Any of the techniques discussed herein can be used for any of these elements, as appropriate.

At 1202, a first semiconductor die, which includes a bonding pad proximate to an edge of the first semiconductor die, is provided. At 1204, a second semiconductor die, which includes a bonding pad proximate to an edge of the second semiconductor die, is provided. The first and second semiconductor dies may be substantially similar to dies 402 and 404 as shown and described with respect to FIG. 4. The wire bonding pads may be substantially similar to wire bond pads 418 and 420 as shown and described with respect to FIG. 4.

At 1206, a pillar is added to the bonding pad on the second semiconductor die. The pillar may be substantially similar to pillars 430 and 432 as shown and described with respect to FIG. 4. In one embodiment the pillar is formed by electroplating (e.g., using RDL or other lithography to define the geometry of the pillar by masking the wire bond pad, and electroplating the defined area of the wire bond pad, while in another embodiment the pillar may be formed by depositing a wire ball on the bonding pad.

At 1208, the first semiconductor die is mounted on top of the second semiconductor die. It is noted that, in this example, the pillars are added to the bonding pads prior to mounting the first die to the second die. In some embodiments, the pillars are added to the bonding pads prior to dicing the dies from a wafer. In some embodiments, the pillars are added to the bonding pads prior to a wafer thinning operation on the wafer and/or dies. The edge of the first die is offset from the edge of the second die such that the pillar is exposed. This arrangement may be similar to the arrangement of die 404 on top of die 402, at minimum edge offset 408, such that pillar 430 is exposed (i.e., not covered by die 404), as shown and described with respect to FIG. 4. It will be understood by those of skill in the art that the dies could be stacked and the pillars formed on each of the dies or alternate dies after such stacking.

At 1210, a wire is bonded to a bonding surface of the pillar, and at 1212, the wire is bonded to a bonding surface of the bonding pad on the first semiconductor die (or to a pillar formed on the bonding pad of the adjacent die). This arrangement may be similar to the wire bond between two adjacent dies 602 as shown and described with respect to FIG. 6, and the wire bonding may be similar to the wire bonding shown and described with respect to FIG. 4.

Figure 13:
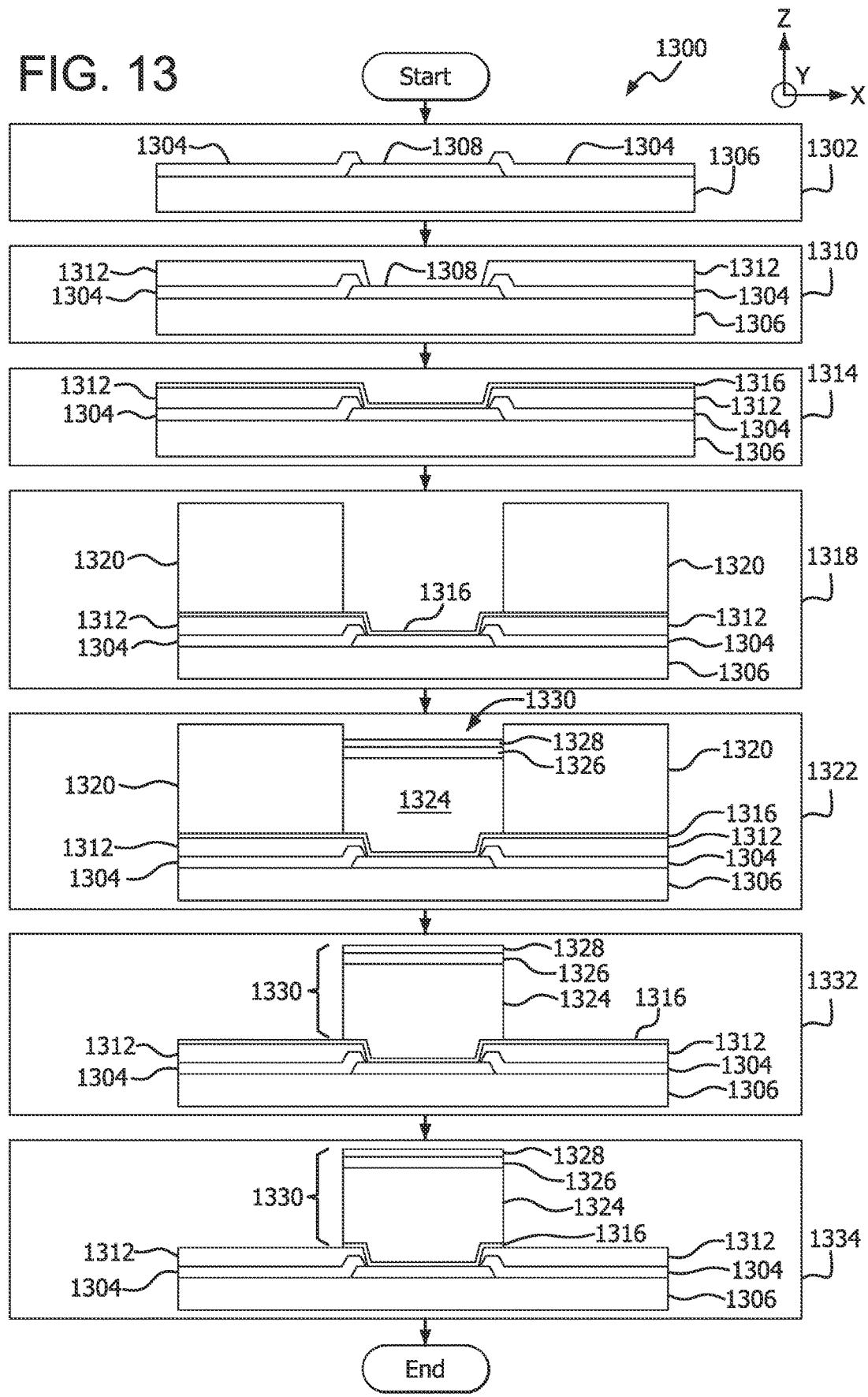
FIG. 13 is a flow chart illustrating an example method for fabricating a pillar.

Referring now to FIG. 13, a flow chart illustrating an example method 1300 for fabricating a pillar is shown. In method 1300, the pillar is fabricated above the wire bonding pad, similar to the arrangement of FIG. 7B. It is noted that in other implementations, an RDL and/or other suitable technique is added to or otherwise used to modify method 1300 in order to fabricate the pillar partially or fully offset (e.g., in the X direction) from the wire bonding pad, similar to the arrangement of FIG. 9B and FIG. 8B, respectively.

In 1302, a passivation layer 1304 on die 1306 partly covers wire bonding pad 1308 such that wire bonding pad 1308 is exposed. Die 1306 and other aspects described with respect to FIG. 13 are shown in cross section. Wire bond pad 1308 is a metal feature that is plated, deposited, etched, or otherwise provided or disposed on the top surface (in the Z direction) of die 1306. In some implementations, wire bonding pad 1308 is made at least partly of any metal or other electrically conductive material suitable for attachment to a typical wire used in wire bonding, such as gold, copper, aluminum, palladium, and so forth, or alloys of any such materials, such as copper/nickel/gold or copper/nickel/palladium/gold alloys or layers, In some implementations, passivation layer 1304 is an inert material (e.g., SiO2) which protects the die surface from contamination, electrical, and/or mechanical damage in some implementations.

In 1310, a polyimide layer 1312 is deposited over passivation layer 1304 such that wire bonding pad 1308 exposed (e.g., by photolithography and development). Polyamide layer 1312 is a layer of polyamide suitable for insulating die 1306 from a metal layer. In some implementations, another polymer or material suitable for insulating die 1306 from a metal layer is used.

In 1314, a metal layer 1316 is deposited over polyimide layer 1312 and wire bonding pad 1308 such that metal layer 1316 is in electrical contact with wire bonding pad 1308. Metal layer 1316 includes any suitable electrically conductive metal, such as an alloy of titanium and copper, suitable for depositing on wire bonding pad 1308. In some implementations, metal layer 1316 is deposited over polyimide layer 1312 and wire bonding pad 1308 by sputtering, or any other suitable process.

In 1318, a pattern resist layer 1320 is applied over metal layer 1316. Pattern resist layer 1320 includes any material suitable for patterning (e.g., photoresist for photolithography, etc.) Pattern resist layer 1320 is patterned and developed such that it does not cover a portion of metal layer 1316 above (in the Z direction) wire bond pad 1308.

In 1322, copper layer 1324, nickel layer 1326, and gold layer 1328 are deposited to form pillar 1330 on top of metal layer 1316 and over (in the Z direction) wire bonding pad 1308. In this example, copper layer 1324 contacts metal layer 1316 and forms the bulk of pillar 1330, gold layer 1328 provides an oxidation resistant bonding surface, and nickel layer 1326 resists copper migration from copper layer 1324 into gold layer 1328. It is noted that the composition of pillar 1330 shown in 1322 is exemplary, and any other suitable metal, combination of metals, or other electrically conductive materials, such as gold, copper, aluminum, palladium, and so forth, or alloys layers of any such materials, such as copper/nickel/gold or copper/nickel/palladium/gold, are usable in other implementations. In 1332, pattern resist layer 1320 is completely removed, using any suitable technique. In 1334, areas of metal layer 1316 not beneath pillar 1330 are etched or otherwise removed from polyimide layer 1312.

It should be understood that many variations are possible based on the disclosure herein. Although features and elements are described above in particular combinations, each feature or element can be used alone without the other features and elements or in various combinations with or without other features and elements.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated.

The invention claimed is:

1. A method for electrically connecting stacked semiconductor dies, wherein the stacked semiconductor dies include a first die having a first bonding pad on a top surface of the first die and proximate to a first edge of the first die and a second die having a second bonding pad on a top surface of the second die and proximate to a second edge of the second die, wherein the second die is mounted on the top surface of the first die such that the second edge is parallel to and offset from the first edge such that the first bonding pad is exposed, the method comprising:

forming a redistribution layer (RDL) on the first bonding pad, wherein the RDL extends toward the first edge from the first bonding pad;

forming an electrically conductive first pillar on the first bonding pad and providing the first pillar on the RDL; and bonding a first wire to a bonding surface of the first pillar, and bonding the first wire to a bonding surface of the second bonding pad.

2. The method of claim 1, wherein forming the first pillar comprises plating or depositing a conductive metal on the first bonding pad.

3. The method of claim 1, wherein the stacked semiconductor dies comprise a third die having a third bonding pad on a top surface of the third die and proximate to a third edge of the third die, wherein the third die is mounted on the top surface of the second die and the third edge is parallel to and offset from the second edge such that the second bonding pad is exposed, the method further comprising:

forming an electrically conductive second pillar on the third bonding pad; and bonding a second wire from the second bonding pad to a bonding surface of the second pillar.

4. The method of claim 1, wherein the bonding surface of the first pillar is level with the top surface of the second die.

5. The method of claim 1, wherein the bonding surface of the first pillar is level with the bonding surface of the second bonding pad.

6. The method of claim 1, wherein the first pillar extends above the top surface of the second die.

7. The method of claim 1, wherein a third edge of the first die perpendicular to the first edge is offset from a fourth edge of the second die perpendicular to the second edge, such that a distance between the first pillar and the second bonding pad is greater than a distance between the first pillar and the second edge.

8. An apparatus for electrically connecting stacked semiconductor dies, wherein the stacked semiconductor dies include a first die having a first bonding pad on a top surface of the first die and proximate a first edge of the first die and a second die having a second bonding pad on a top surface of the second die and proximate to a second edge of the second die, wherein the second die is mounted on the top surface of the first die such that the second edge is parallel to and offset from the first edge such that the first bonding pad is exposed, the apparatus comprising:

means for forming a redistribution layer (RDL) on the first bonding pad, wherein the RDL extends toward the first edge of the first die from the first bonding pad;

means for forming an electrically conductive first pillar on the first bonding pad and means for providing the first pillar on the RDL; and means for bonding a first wire to a bonding surface of the first pillar, and bonding the first wire to a bonding surface of the second bonding pad.

9. The apparatus of claim 8, wherein the means for forming the first pillar is configured to plate or deposit a conductive metal on the first bonding pad.

10. The apparatus of claim 8, wherein the stacked semiconductor dies comprise a third die having a third bonding pad on a top surface of the third die and proximate to a third edge of the third die, wherein the third die is mounted on the top surface of the second die and the third edge is parallel to and offset from the second edge such that the second bonding pad is exposed, the apparatus further comprising:

means for forming an electrically conductive second pillar on the third bonding pad; and means for bonding a second wire from the second bonding pad to a bonding surface of the second pillar.

11. The apparatus of claim 8, wherein the bonding surface of the first pillar is level with the top surface of the second die.

12. The apparatus of claim 8, wherein the bonding surface of the first pillar is level with the bonding surface of the second bonding pad.

13. The apparatus of claim 8, wherein the first pillar extends above the top surface of the second die.

14. The apparatus of claim 8, wherein a third edge of the first die perpendicular to the first edge is offset from a fourth edge of the second die perpendicular to the second edge, such that a distance between the first pillar and the second bonding pad is greater than a distance between the first pillar and the second edge.

15. A method for electrically connecting stacked semiconductor dies, wherein the stacked semiconductor dies include a first die having a first bonding pad on a top surface of the first die and proximate to a first edge of the first die and a second die having a second bonding pad on a top surface of the second die and proximate to a second edge of the second die, wherein the second die is mounted on the top surface of the first die such that the second edge is parallel to and offset from the first edge such that the first bonding pad is exposed, the method comprising:

increasing a height of a bonding surface of the first bonding pad by forming a pillar on the first bonding pad; and electrically connecting, by a first wire, the bonding surface of the first bonding pad to the second bonding pad.

16. The method of claim 15, further comprising:

increasing a height of a bonding surface of a third bonding pad of a third die, the third bonding pad disposed on a top surface of the third die and proximate to a third edge of the third die, wherein the third die is mounted on the second die such that the third edge is parallel to and offset from the second edge such that the second bonding pad is exposed; and electrically connecting, by a second wire, the second bonding pad to the bonding surface of the third bonding pad.

17. The method of claim 15, wherein increasing the height of the bonding surface of the first bonding pad further comprises plating or depositing a conductive metal on the first bonding pad.

* * * * *